(12) United States Patent
Jang

(10) Patent No.: US 8,638,152 B2
(45) Date of Patent: Jan. 28, 2014

(54) SIGNAL TRANSMISSION CIRCUITS

(71) Applicant: SK Hynix Inc., Icheon (KR)

(72) Inventor: Dong Wook Jang, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/717,580

(22) Filed: Dec. 17, 2012

(65) Prior Publication Data

US 2014/0002163 A1 Jan. 2, 2014

(30) Foreign Application Priority Data

Jun. 29, 2012 (KR) .................. 10-2012-0070626

(51) Int. Cl.
*H03H 11/16* (2006.01)

(52) U.S. Cl.
USPC ............ 327/231; 327/235; 327/355; 327/361

(58) Field of Classification Search
USPC ............... 327/99, 231, 235, 298, 355, 361
See application file for complete search history.

(56) References Cited

U.S. PATENT DOCUMENTS 6,608,514 B1 * 8/2003 Akita et al. .................. 327/291
2005/0110554 A1 * 5/2005 Lee .............................. 327/355

FOREIGN PATENT DOCUMENTS

KR 10-2009-0114630 A 11/2009
KR 10-2010-0043971 A 4/2010

* cited by examiner

*Primary Examiner* — An Luu

(57) ABSTRACT

A signal transmission circuit includes a first selection driver configured to generate a first drive signal in response to an input signal and a first selection signal and drive a transmission signal in response to the first drive signal, and a second selection driver configured to delay the input signal by a first delay time to generate a first delay signal. The second selection driver generates a second drive signal in response to the first delay signal and a second selection signal, generates a first code signal in response to the input signal and the second selection signal, and drives the transmission signal in response to the second drive signal and the first code signal.

26 Claims, 9 Drawing Sheets

SIGNAL TRANSMISSION CIRCUITS

CROSS-REFERENCES TO RELATED APPLICATIONS

The present application claims priority under 35 U.S.C 119(a) to Korean Application No. 10-2012-0070626, filed on Jun. 29, 2012, in the Korean Intellectual Property Office, which is incorporated herein by reference in its entirety as set forth in full.

BACKGROUND

In general, a transmitting stage or a receiving stage of a semiconductor integrated circuit is coupled to a termination resistor having the same resistance as an impedance of a transmission channel. The termination resistor may match the impedance of the transmission channel with an impedance of the transmitting or receiving stage to suppress reflection of signals (including data) transmitted through the transmission channel.

In integrated circuits such as central processing units (CPUs) or graphic memory devices, which have relatively low restrictions in terms of power consumption, a termination resistor electrically coupled to a receiving stage has been widely employed to effectively suppress the signal reflection. However, in the event that the termination resistor is electrically coupled to the receiving stage, a direct current (DC) always flows through the termination resistor to cause high power consumption. Thus, it may be difficult to use a design scheme employing the termination resistor coupled to the receiving stage in some integrated circuits such as mobile devices or systems having a relatively high restriction in terms of power consumption. Accordingly, mobile devices or systems having relatively high restrictions in power consumption employ a design scheme in which the termination resistor is coupled to a transmitting stage.

The design scheme having the termination resistor coupled to the transmitting stage may be implemented using a signal transmission circuit. More specifically, integrated circuits may include a transmission circuit that is coupled to the transmitting stage to transmit signals through a transmission channel, and an impedance of the transmission channel may be matched with an impedance of the transmission stage by controlling electrical resistance of the transmission circuit. The transmission circuit may include a plurality of drivers for driving the signals transmitted through the transmission channel. The electrical resistance of the transmission circuit may be controlled by selectively turning on at least one of the plurality of drivers.

SUMMARY

In accordance with an embodiment, a signal transmission circuit includes a first selection driver configured to generate a first drive signal in response to an input signal and a first selection signal and drive a transmission signal in response to the first drive signal, and a second selection driver configured to delay the input signal by a first delay time to generate a first delay signal. The second selection driver generates a second drive signal in response to the first delay signal and a second selection signal, generates a first code signal in response to the input signal and the second selection signal, and drives the transmission signal in response to the second drive signal and the first code signal.

In accordance with another embodiment, a signal transmission circuit includes a delay portion configured to delay an input signal by a predetermined delay time to generate a delay signal, a drive signal generator configured to generate a drive signal that is enabled when the delay signal is enabled during enablement of a selection signal, a code generator configured to generate a code signal that is enabled when the input signal is enabled during enablement of the selection signal, and a first driver configured to drive a transmission signal in response to the drive signal and the code signal.

In accordance with still another embodiment, a signal transmission circuit includes a first switch which electrically connects a power supply terminal to a first node and which is turned in response to a drive signal, a first resistive element which electrically connects the first node to an output node through which a transmission signal is outputted, a second switch which electrically connects the power supply terminal to a second node and which is turned on in response to a code signal, and a second resistive element which electrically connects the second node to the output node.

BRIEF DESCRIPTION OF THE DRAWINGS

Embodiments will become more apparent in view of the attached drawings and accompanying detailed description, in which.

DETAILED DESCRIPTION OF THE EMBODIMENTS

Embodiments of will be described hereinafter with reference to the accompanying drawings. However, the embodiments described herein are for illustrative purposes only, and are not intended to limit the scope.

Figure 1:
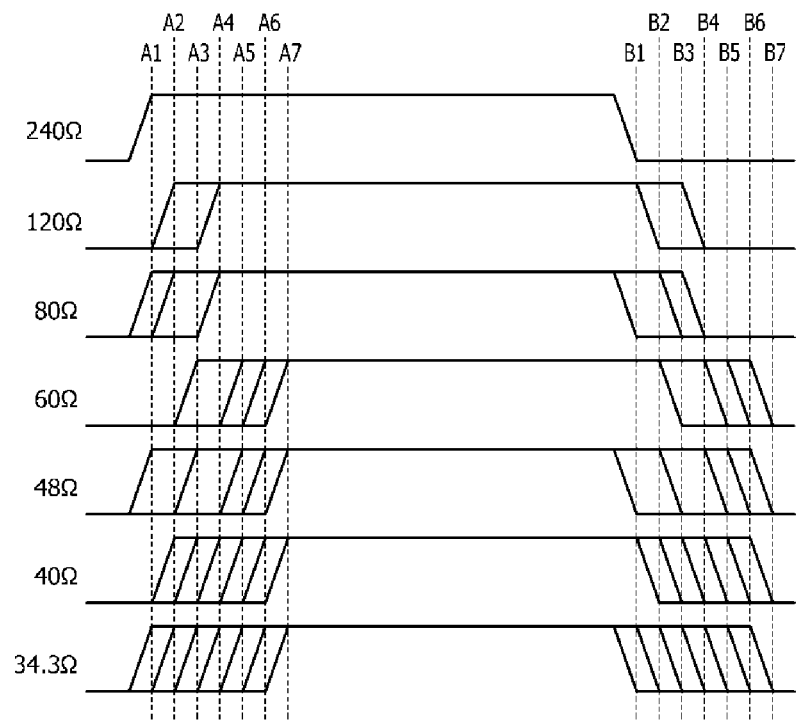
FIG. 1 illustrates a waveform diagram of a transmission signal outputted from a signal transmission circuit, depending on various electrical resistances of the signal transmission circuit.

FIG. 1 illustrates a waveform diagram of a transmission signal outputted from a signal transmission circuit including a plurality of drivers, which are sequentially turned on, depending on various electrical resistances of the signal transmission circuit.

Although it is not shown, a signal transmission circuit for generating the transmission signal having waveforms as shown in FIG. 1 may include seven pull-up drivers and seven pull-down drivers. The seven pull-up drivers are sequentially turned on in a period of a time "A1" to a time "A7" to pull up the transmission signal. The seven pull-down drivers are sequentially turned on in a period of a time "B1" to a time "B7" to pull down the transmission signal. The number of the pull-up drivers or pull-down drivers may vary according to an electrical resistance of the signal transmission circuit. For example, if the signal transmission circuit is set to have an electrical resistance of about 240 ohms (Ω), only the pull-up driver turned on at the time "A1" and the pull-down driver turned on at the time "B1" may be activated to output the transmission signal.

In order to set the signal transmission circuit to have a lower resistance of, e.g., 120Ω, 80Ω, 60Ω, 48Ω, 40Ω or 34Ω, the number of the pull-up drivers and the pull-down drivers, which are sequentially turned on, increases. For example, if the signal transmission circuit is set to have an electrical resistance of about 34Ω, all of the seven pull-up drivers may be sequentially turned on in the period from the time "A1" to the time "A7" to pull up the transmission signal, and all of the seven pull-down drivers may be sequentially turned on in the period of the time "B1" to the time "B7" to pull down the transmission signal. The reason for sequentially turning on the pull-up drivers and the pull-down drivers in the signal transmission circuit is to reduce an amount of a peak current flowing through the signal transmission circuit by dispersing the points of time that the transmission signal is driven.

A slew rate of the transmission signal driven by the signal transmission circuit described above may depend on points of time that the pull-up drivers and the pull-down drivers are turned on. As described above, the points of time that the pull-up drivers and the pull-down drivers are turned on may vary according to the electrical resistance of the signal transmission circuit. Thus, the slew rate of the transmission signal may change significantly according to the electrical resistance of the signal transmission circuit.

Figure 2:
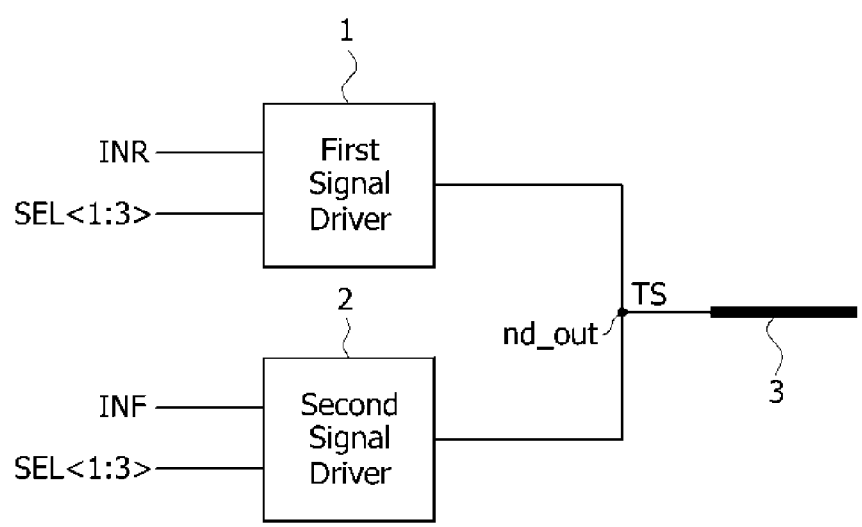
FIG. 2 is a block diagram of a signal transmission circuit according to an embodiment.

FIG. 2 is a block diagram of a signal transmission circuit according to an embodiment.

Referring to FIG. 2, the signal transmission circuit includes a first signal driver 1 and a second signal driver 2. The first signal driver 1 pulls up a transmission signal TS transmitted through a transmission channel 3 in response to a first input signal INR, for example, a pull-up input signal. The second signal driver 2 pulls down the transmission signal TS transmitted through the transmission channel 3 in response to a second input signal INF, for example, a pull-down input signal. An electrical resistance of each of the first and second signal drivers 1 and 2 may be determined by first to third selection signals SEL<1:3>. An electrical resistance of the signal transmission circuit may be set to have the same value as an impedance of the transmission channel 3 in order to achieve successful impedance matching between the signal transmission circuit and the transmission channel 3.

For example, if the transmission channel 3 has an impedance of about 120Ω, each of the first and second signal drivers 1 and 2 may be set to have an electrical resistance of about 240Ω because the first and second signal drivers 1 and 2 are electrically coupled in parallel to the transmission channel 3. A mode register setting operation may determine which of the first to third selection signals SEL<1:3> is (or are) enabled. In an embodiment, the pull-up input signal INR may be enabled when the transmission signal TS having a logic "high" state is transmitted to the transmission channel 3, and the pull-down input signal INF may be enabled when the transmission signal TS having a logic "low" state is transmitted to the transmission channel 3.

Hereinafter, configurations and operations of the first signal driver 1 will be described with reference to FIGS. 3, 4, and 5, and configurations and operations of the second signal driver 2 will be described with reference to FIGS. 6, 7, and 8.

Figure 3:
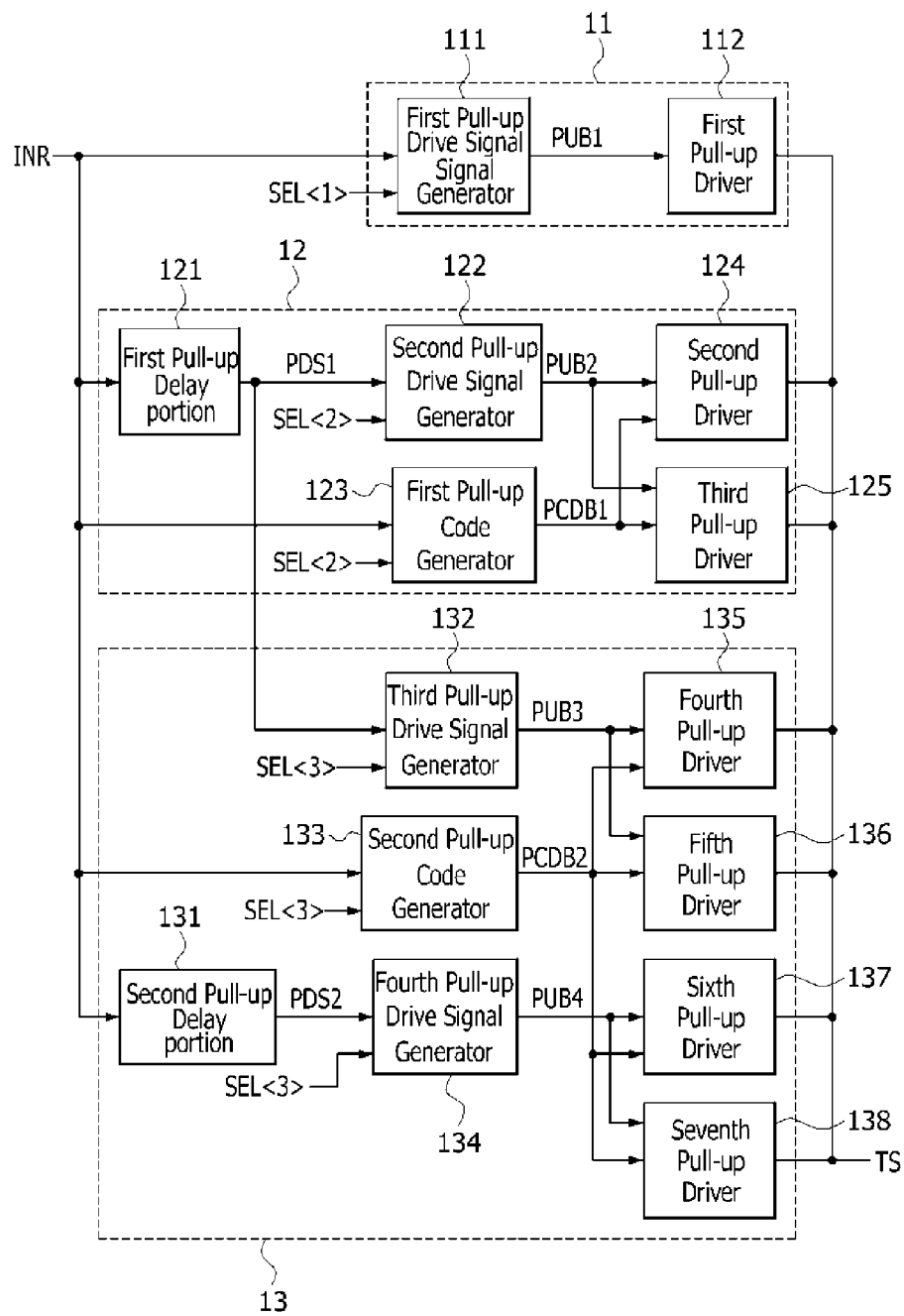
FIG. 3 is a block diagram of a first data driver in the signal transmission circuit of FIG. 2 according to an embodiment.

Referring to FIG. 3, the first signal driver 1 includes a first pull-up selection driver 11, a second pull-up selection driver 12, and a third pull-up selection driver 13. The first pull-up selection driver 11 includes a first pull-up drive signal generator 111 and a first pull-up driver 112. The second pull-up selection driver 12 includes a first pull-up delay portion 121, a second pull-up drive signal generator 122, a first pull-up code generator 123, a second pull-up driver 124, and a third pull-up driver 125. The third pull-up selection driver 13 includes a second pull-up delay portion 131, a third pull-up drive signal generator 132, a second pull-up code generator 133, a fourth pull-up drive signal generator 134, a fourth pull-up driver 135, a fifth pull-up driver 136, a sixth pull-up driver 137, and a seventh pull-up driver 138.

The first pull-up drive signal generator 111 generates a first pull-up drive signal PUB1 in response to the first selection signal SEL<1> and the first input signal INR. For example, if the first input signal INR is enabled to have a logic "high" state while the first selection signal SEL<1> is enabled to have a logic "high" state, the first pull-up drive signal generator 111 generates the first pull-up drive signal PUB1 which is enabled to have a logic "low" state. The first pull-up driver 112 receives the first pull-up drive signal PUB1 which is enabled and pulls up the transmission signal TS, such that the first pull-up driver 112 has a predetermined unit resistance.

The first pull-up delay portion 121 may delay the first input signal INR by a first delay time and generate a first pull-up delay signal PDS1. The second pull-up drive signal generator 122 may generate a second pull-up drive signal PUB2 which is enabled when the second selection signal SEL<2> and the first pull-up delay signal PDS1 are enabled. The first pull-up code generator 123 may generate a first pull-up code signal PCDB1 which is enabled when the second selection signal SEL<2> and the first input signal INR are enabled. The second pull-up driver 124 receives the second pull-up drive signal PUB2 and the first pull-up code signal PCDB1, which are enabled, and pulls up the transmission signal TS, such that the second pull-up driver 124 has a predetermined unit resistance. Similarly, the third pull-up driver 125 receives the second pull-up drive signal PUB2 and the first pull-up code signal PCDB1, which are enabled, and pulls up the transmission signal TS, such that the third pull-up driver 125 has a predetermined unit resistance.

The second pull-up delay portion 131 may delay the first input signal INR by a second delay time and generate a second pull-up delay signal PDS2. The third pull-up drive signal generator 132 may generate a third pull-up drive signal PUB3 which is enabled when the third selection signal SEL<3> and the first pull-up delay signal PDS1 are enabled. The second pull-up code generator 133 may generate a second pull-up code signal PCDB2 which is enabled when the third selection signal SEL<3> and the first input signal INR are enabled. The fourth pull-up drive signal generator 134 may generate a fourth pull-up drive signal PUB4, which is enabled when the third selection signal SEL<3> and the second pull-up delay signal PDS2 are enabled.

The fourth pull-up driver 135 receives the third pull-up drive signal PUB3 and the second pull-up code signal PCDB2, which are enabled, and pulls up the transmission signal TS, such that the fourth pull-up driver 135 has a predetermined unit resistance. Similarly, the fifth pull-up driver 136 receives the third pull-up drive signal PUB3 and the second pull-up code signal PCDB2, which are enabled, and pulls up the transmission signal TS, such that the fifth pull-up driver 136 has a predetermined unit resistance. The sixth pull-up driver 137 receives the fourth pull-up drive signal PUB4 and the second pull-up code signal PCDB2, which are enabled, and pulls up the transmission signal TS, such that the sixth pull-up driver 137 has a predetermined unit resistance. Similarly, the seventh pull-up driver 138 receives the fourth pull-up drive signal PUB4 and the second pull-up code signal PCDB2, which are enabled, and pulls up the transmission signal TS, such that the seventh pull-up driver 138 has a predetermined unit resistance. In an embodiment, the second delay time is set to be shorter than the first delay time.

Figure 4:
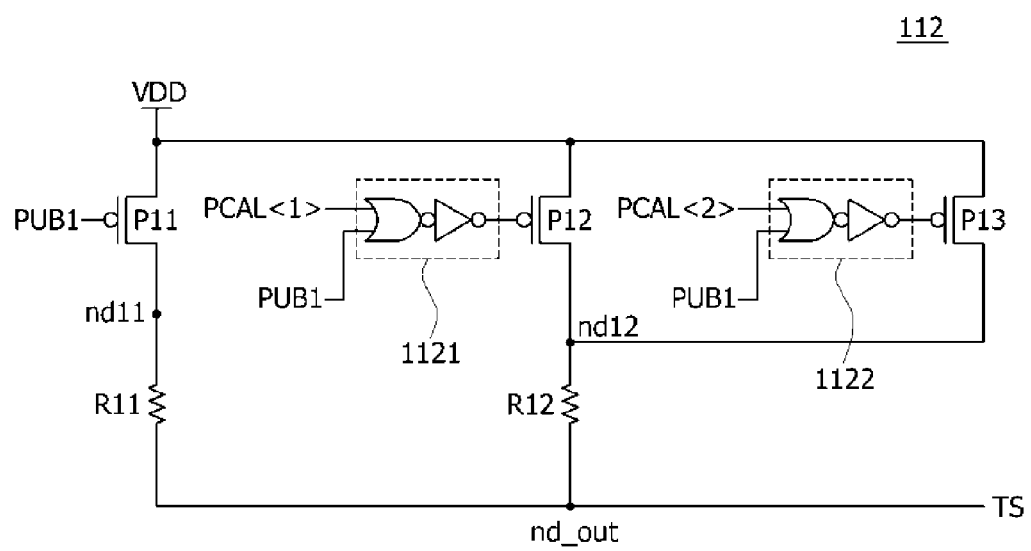
FIG. 4 is a circuit diagram of a first pull-up driver in the first data driver of FIG. 3 according to an embodiment.

Referring to FIG. 4, the first pull-up driver 112 includes a PMOS transistor P11 that electrically couples a power supply terminal VDD to a node ND11. The PMOS transistor P11 acts as a switch that is turned on when the first pull-up drive signal PUB1, which is enabled to have a logic "low" state, is applied to a gate thereof. The first pull-up driver 112 further includes a resistive element R11 that is coupled to and disposed between the node ND11 and an output node ND_OUT through which the transmission signal TS is outputted, a first arithmetic logic unit (ALU) 1121 that receives a first pull-up calibration code signal PCAL<1> and the first pull-up drive signal PUB1 to execute logical operations, a PMOS transistor P12 that electrically couples the power supply terminal VDD to a node ND12 and acts as a switch which is turned on in response to an output signal of the first ALU 1121, a second ALU 1122 that receives a second pull-up calibration code signal PCAL<2> and the first pull-up drive signal PUB1 to execute logical operations, a PMOS transistor P13 that electrically couples the power supply terminal VDD to the node ND12 and acts as a switch which is turned on in response to an output signal of the second ALU 1122, and a resistive element R12 that is coupled to and disposed between the node ND12 and the output node ND_OUT.

The first and second pull-up calibration code signals PCAL<1:2> may be generated by an impedance calibration circuit (not shown) to calibrate an electrical resistance, i.e., an impedance, of the signal transmission circuit, which is changed according to variation of PVT (process, voltage and/or temperature) conditions. The impedance calibration circuit may include a comparator that compares a voltage level induced at a ZQ pad coupled to an external resistor with a reference voltage level.

The first pull-up driver 112 may pull up the transmission signal TS at a point of time when the first pull-up drive signal PUB1 is enabled to have a logic "low" state. As a result, the first pull-up driver 112 has a unit resistance which is set according to logic levels of the first and second pull-up calibration code signals PCAL<1:2>. The unit resistance of the first pull-up driver 112 may be set to have any of several values according to the logic levels of the first and second pull-up calibration code signals PCAL<1:2> and resistance values of the resistive elements R11 and R12.

Figure 5:
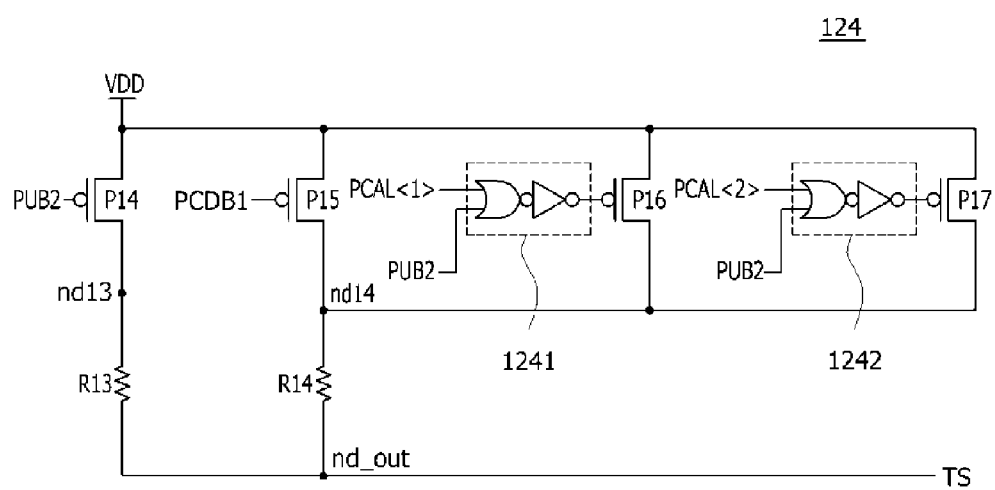
FIG. 5 is a circuit diagram of a second pull-up driver in the first data driver of FIG. 3 according to an embodiment.

Referring to FIG. 5, the second pull-up driver 124 includes a PMOS transistor P14 that electrically couples the power supply terminal VDD to a node ND13. The PMOS transistor P14 acts as a switch that is turned on when the second pull-up drive signal PUB2 enabled to have a logic "low" state is applied to a gate thereof. The second pull-up driver 124 further includes a resistive element R13 that is coupled to and disposed between the node ND13 and the output node ND_OUT through which the transmission signal TS is outputted, and a PMOS transistor P15 that electrically couples the power supply terminal VDD to a node ND14 and acts as a switch that is turned on when the first pull-up code signal PCDB1 enabled to have a logic "low" state is applied to a gate thereof. The second pull-up driver also includes a first ALU 1241 that receives the first pull-up calibration code signal PCAL<1> and the second pull-up drive signal PUB2 to execute logical operations, a PMOS transistor P16 that electrically couples the power supply terminal VDD to the node ND14 and acts as a switch which is turned on in response to an output signal of the first ALU 1241, a second ALU 1242 that receives the second pull-up calibration code signal PCAL<2> and the second pull-up drive signal PUB2 to execute logical operations, a PMOS transistor P17 that electrically couples the power supply terminal VDD to the node ND14 and acts as a switch which is turned on in response to an output signal of the second ALU 1242, and a resistive element R14 that is coupled to and disposed between the node ND14 and the output node ND_OUT. The second pull-up drive signal PUB2 may be generated in synchronization with the first pull-up delay signal PDS1, and the first pull-up code signal PCDB1 may be generated in synchronization with the first input signal INR. Thus, the second pull-up drive signal PUB2 may be enabled after the first delay time passes from a point of time when the first pull-up code signal PCDB1 is enabled.

The second pull-up driver 124 may pull up the transmission signal TS to have a first unit resistance when the first pull-up code signal PCDB1 is enabled. If the first pull-up code signal PCDB1 is enabled to have a logic "low" state, the PMOS transistor P15 is turned on. At this time, the PMOS transistors P14, P16, and P17 are turned off since the second pull-up drive signal PUB2 maintains a disabled state, i.e., a logic "high" state, until the first delay time passes and thus both of the first pull-up delay signal PDS1 and the second selection signal SEL<2> are enabled to have a logic "high" state. Thus, the second pull-up driver 124 may pull up the level of the transmission signal TS to have the first unit resistance that corresponds to a sum of an "on-state" resistance of the PMOS transistor P15 and a resistance of the resistive element R14. If the second pull-up drive signal PUB2 is enabled after the first pull-up code signal PCDB1 is enabled, the second pull-up driver 124 pulls up the level of the transmission signal TS to have a second unit resistance.

That is, if both the first pull-up code signal PCDB1 and the second pull-up drive signal PUB2 are enabled to have a logic "low" state, the PMOS transistors P14 and P15 are turned on, and on/off states of the PMOS transistors P16 and P17 depend on the first and second pull-up calibration code signals PCAL<1:2>. Thus, the second pull-up driver 124 pulls up the level of the transmission signal TS to have the second unit resistance, which is set according to on/off resistances of the PMOS transistors P14, P15, P16, and P17 and the resistances of the resistive elements R13 and R14. The lower the first and second unit resistances are, the stronger the drivability of the second pull-up driver 124 for pulling up the transmission signal TS is.

The second pull-up driver 124 may indirectly pull up the transmission signal TS to have a predetermined resistance value (e.g., the second unit resistance) while the first pull-up driver 112 directly pulls up the transmission signal TS to have a predetermined resistance value. That is, the second pull-up driver 124 may sequentially pull up the transmission signal TS according to the first pull-up code signal PCDB1 and the second pull-up drive signal PUB2, so that the second pull-up driver 124 may have the first unit resistance and the second unit resistance in order. The second unit resistance of the second pull-up driver 124 may be smaller than the first unit resistance and may be substantially the same as the unit resistance of the first pull-up driver 112. Thus, the drivability of the second pull-up driver 124 for pulling up the transmission signal TS when both the first pull-up code signal PCDB1 and the second pull-up drive signal PUB2 are enabled may be stronger than the drivability of the second pull-up driver 124 for pulling up the transmission signal TS when the first pull-up code signal PCDB1 is enabled while the second pull-up drive signal PUB2 is disabled. As a result, a peak current flowing through the second pull-up driver 124 may be reduced by controlling the drivability of the second pull-up driver 124 using the first pull-up code signal PCDB1 as well as the second pull-up drive signal PUB2.

The third pull-up driver 125 may have substantially the same configuration as that of the second pull-up driver 124. Thus, the third pull-up driver 125 may sequentially pull up the transmission signal TS according to the first pull-up code signal PCDB1 and the second pull-up drive signal PUB2, so that the third pull-up driver 125 may have the first unit resistance and the second unit resistance in order like the second pull-up driver 124. Each of the fourth and fifth pull-up drivers 135 and 136 may also have substantially the same configuration as that of the second pull-up driver 124 and thus sequentially pull up the transmission signal TS according to the second pull-up code signal PCDB2 and the third pull-up drive signal PUB3, so that each of the fourth and fifth pull-up drivers 135 and 136 may have a third unit resistance and a fourth unit resistance sequentially. Similarly, each of the sixth and seventh pull-up drivers 137 and 138 may have substantially the same configuration as that of the second pull-up driver 124 and thus sequentially pull up the transmission signal TS according to the second pull-up code signal PCDB2 and the fourth pull-up drive signal PUB4, so that each of the sixth and seventh pull-up drivers 137 and 138 may have a fifth unit resistance and a sixth unit resistance in order. In an embodiment, the fourth unit resistance may be set to be smaller than the third unit resistance, and the sixth unit resistance may be set to be smaller than the fifth unit resistance. Further, the fourth and sixth unit resistances may be substantially the same as the unit resistance of the first pull-up driver 112.

In conclusion, the first pull-up selection driver 11 may pull up the transmission signal TS with the drivability that is set at a point of time when the first pull-up drive signal PUB1 is enabled when the first selection signal SEL<1> is enabled. The second pull-up selection driver 12 may sequentially pull up the transmission signal TS with the drivability that is set at points of time when the first pull-up code signal PCDB1 and the second pull-up drive signal PUB2 are enabled when the second selection signal SEL<2> is enabled. The third pull-up selection driver 13 may sequentially pull up the transmission signal TS with the drivability that is set at points of time when the second pull-up code signal PCDB2, the third pull-up drive signal PUB3, and the fourth pull-up drive signal PUB4 are enabled when the third selection signal SEL<3> is enabled. The first pull-up drive signal PUB1, the first pull-up code signal PCDB1, and the second pull-up code signal PCDB2 may be enabled at a point of time when the first input signal INR is enabled according to enabled states of the selection signals SEL<1:3>. The second pull-up drive signal PUB2 and the third pull-up drive signal PUB3 may be enabled after the first delay time passes from the point of time that the first input signal INR is enabled, and the fourth pull-up drive signal PUB4 may be enabled after the second delay time passes from the point of time that the first input signal INR is enabled. Thus, in this embodiment, the pull-up drivability of the signal transmission circuit may vary at points of time that the first input signal INR, the first pull-up delay signal PDS1, and the second pull-up delay signal PDS2 are enabled.

Figure 6:
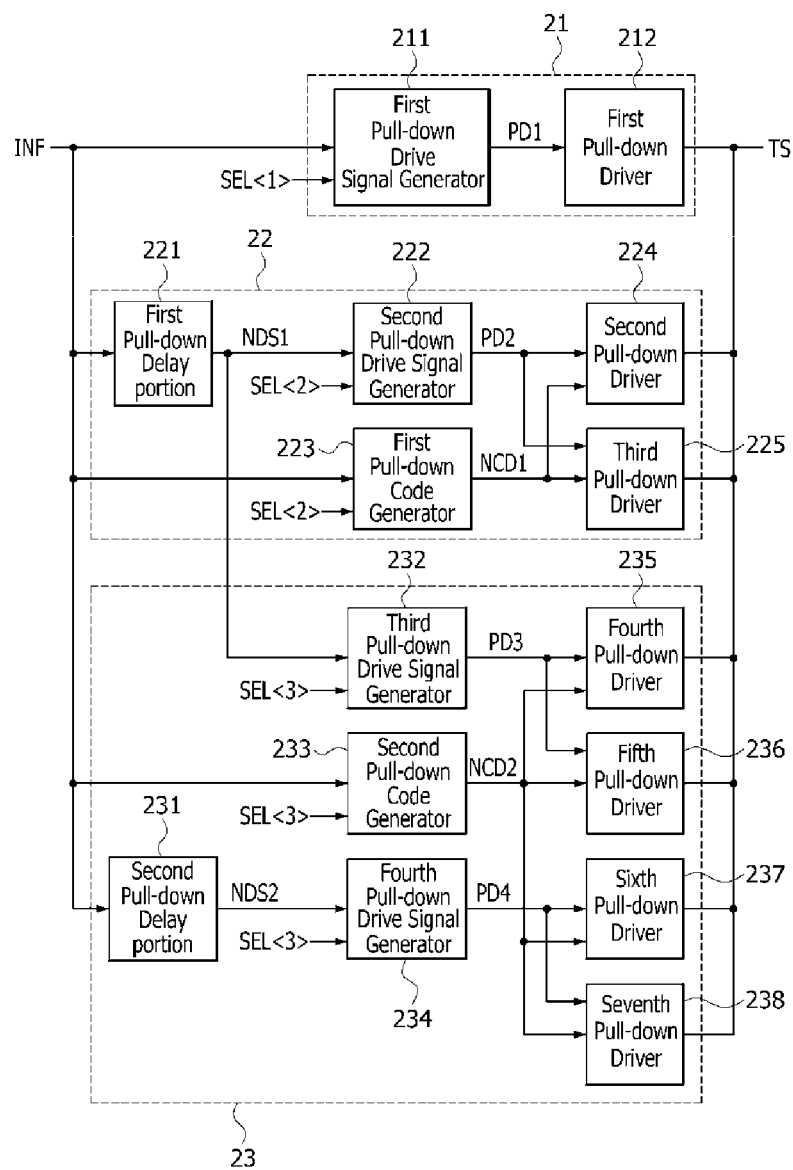
FIG. 6 is a block diagram of a second data driver in the signal transmission circuit of FIG. 2 according to an embodiment.

Referring to FIG. 6, the second signal driver 2 includes a first pull-down selection driver 21, a second pull-down selection driver 22, and a third pull-down selection driver 23. The first pull-down selection driver 21 includes a first pull-down drive signal generator 211 and a first pull-down driver 212.

The second pull-down selection driver 22 includes a first pull-down delay portion 221, a second pull-down drive signal generator 222, a first pull-down code generator 223, a second pull-down driver 224, and a third pull-down driver 225. The third pull-down selection driver 23 includes a second pull-down delay portion 231, a third pull-down drive signal generator 232, a second pull-down code generator 233, a fourth pull-down drive signal generator 234, a fourth pull-down driver 235, a fifth pull-down driver 236, a sixth pull-down driver 237, and a seventh pull-down driver 238.

The first pull-down drive signal generator 211 may generate a first pull-down drive signal PD1 in response to the first selection signal SEL<1> and the second input signal INF. For example, if the second input signal INR is enabled to have a logic "high" state while the first selection signal SEL<1> is enabled to have a logic "high" state, the first pull-down drive signal generator 211 may generate the first pull-down drive signal PD1 which is enabled to have a logic "high" state. The first pull-down driver 212 receives the first pull-down drive signal PD1 which is enabled and pulls down the transmission signal TS, such that the first pull-down driver 212 has a predetermined unit resistance.

The first pull-down delay portion 221 may delay the second input signal INF by the first delay time and generate a first pull-down delay signal NDS1. The second pull-down drive signal generator 222 may generate a second pull-down drive signal PD2 which is enabled when the second selection signal SEL<2> and the first pull-down delay signal NDS1 are enabled. The first pull-down code generator 223 may generate a first pull-down code signal NCD1 which is enabled when the second selection signal SEL<2> and the second input signal INF are enabled. The second pull-down driver 224 receives the second pull-down drive signal PD2 and the first pull-down code signal NCD1, which are enabled, and pulls down the transmission signal TS, such that the second pull-down driver 224 has a predetermined unit resistance. Similarly, the third pull-down driver 225 receives the second pull-down drive signal PD2 and the first pull-down code signal NCD1, which are enabled, and pulls down the transmission signal TS, such that the third pull-down driver 225 has a predetermined unit resistance.

The second pull-down delay portion 231 may delay the second input signal INF by the second delay time and generate a second pull-down delay signal NDS2. The third pull-down drive signal generator 232 may generate a third pull-down drive signal PD3 which is enabled when the third selection signal SEL<3> and the first pull-down delay signal NDS1 are enabled. The second pull-down code generator 233 may generate a second pull-down code signal NCD2 which is enabled when the third selection signal SEL<3> and the second input signal INF are enabled. The fourth pull-down drive signal generator 234 may generate a fourth pull-down drive signal PD4 which is enabled when the third selection signal SEL<3> and the second pull-down delay signal NDS2 are enabled. The fourth pull-down driver 235 receives the third pull-down drive signal PD3 and the second pull-down code signal NCD2, which are enabled, and pulls down the transmission signal TS, such that the fourth pull-down driver 235 has a predetermined unit resistance.

Similarly, the fifth pull-down driver 236 receives the third pull-down drive signal PD3 and the second pull-down code signal NCD2, which are enabled, and pulls down the transmission signal TS, such that the fifth pull-down driver 236 has a predetermined unit resistance. The sixth pull-down driver 237 receives the fourth pull-down drive signal PD4 and the second pull-down code signal NCD2, which are enabled, and pulls down the transmission signal TS, such that the sixth pull-down driver 237 has a predetermined unit resistance. Similarly, the seventh pull-down driver 238 receives the fourth pull-down drive signal PD4 and the second pull-down code signal NCD2, which are enabled, and pulls down the transmission signal TS, such that the seventh pull-down driver 238 has a predetermined unit resistance. In an embodiment, the second delay time of the second pull-down delay portion 231 may be set to be shorter than the first delay time of the first pull-down delay portion 221.

Figure 7:
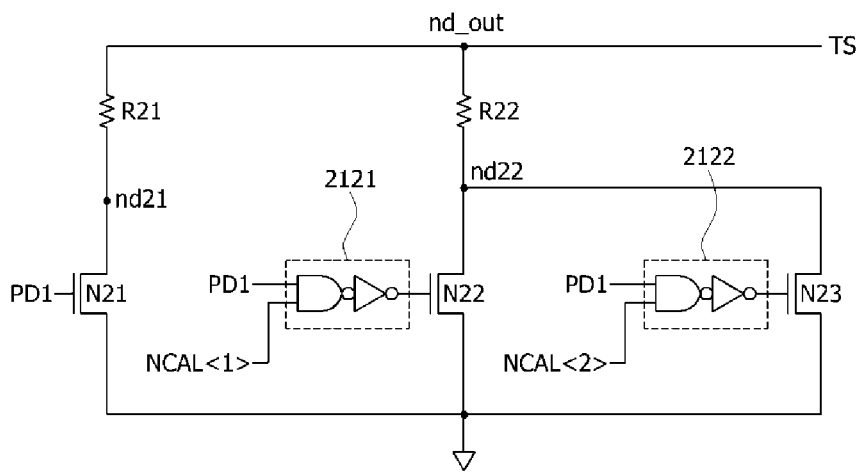
FIG. 7 is a circuit diagram of a first pull-up driver in the second data driver of FIG. 6 according to an embodiment

Referring to FIG. 7, the first pull-down driver 212 includes an NMOS transistor N21 that electrically couples a ground voltage terminal to a node ND21 and acts as a switch which is turned on when the first pull-down drive signal PD1 enabled to have a logic "high" state is applied to a gate thereof. The first pull-down driver 212 further includes a resistive element R21 that is coupled to and disposed between the node ND21 and the output node ND_OUT through which the transmission signal TS is outputted, a first ALU 2121 that receives a first pull-down calibration code signal NCAL<1> and the first pull-down drive signal PD1 to execute logical operations, an NMOS transistor N22 that electrically couples the ground voltage terminal to a node ND22 and acts as a switch which is turned on in response to an output signal of the first ALU 2121, a second ALU 2122 that receives a second pull-down calibration code signal NCAL<2> and the first pull-down drive signal PD1 to execute logical operations, an NMOS transistor N23 that electrically couples the ground voltage terminal to the node ND22 and acts as a switch which is turned on in response to an output signal of the second ALU 2122, and a resistive element R22 that is coupled to and disposed between the node ND22 and the output node ND_OUT.

The first and second pull-down calibration code signals NCAL<1:2> may be generated by the impedance calibration circuit to calibrate the electrical resistance of the signal transmission circuit, which is changed according to variation of PVT (process, voltage and/or temperature) conditions.

The first pull-down driver 212 may pull down the transmission signal TS at a point of time when the first pull-down drive signal PD1 is enabled to have a logic "high" state, so that the first pull-down driver 212 has a predetermined unit resistance which is set according to logic levels of the first and second pull-down calibration code signals NCAL<1:2>. The predetermined unit resistance of the first pull-down driver 212 may be set to have any of several values according to the logic levels of the first and second pull-down calibration code signals NCAL<1:2> and resistance values of the resistive elements R21 and R22.

Figure 8:
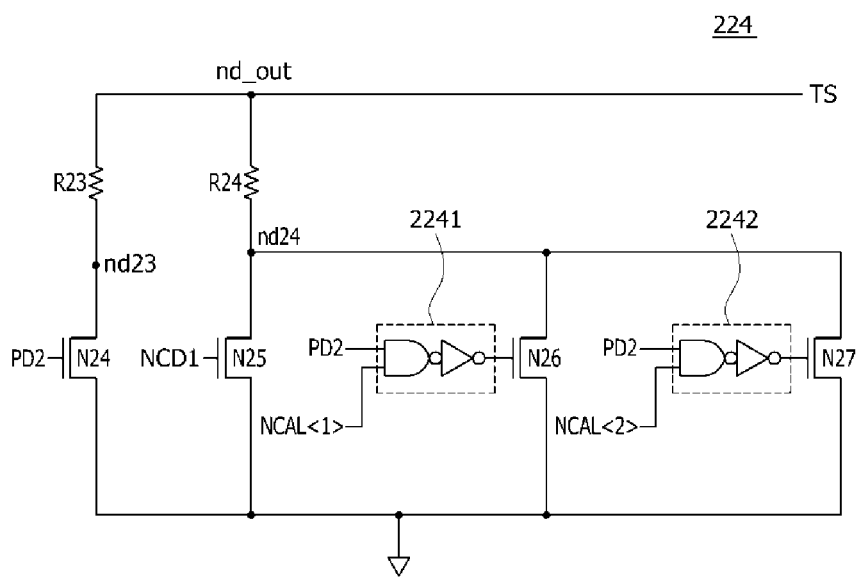
FIG. 8 is a circuit diagram of a second pull-up driver in the second data driver of FIG. 6 according to an embodiment.

Referring to FIG. 8, the second pull-down driver 224 includes an NMOS transistor N24 that electrically couples the ground voltage terminal to a node ND23 and acts as a switch which is turned on when the second pull-down drive signal PD2 enabled to have a logic "high" state is applied to a gate thereof. The second pull-down driver 223 further includes a resistive element R23 that is coupled to and disposed between the node ND23 and the output node ND_OUT through which the transmission signal TS is outputted, and an NMOS transistor N25 that electrically couples the ground voltage terminal to a node ND24 and acts as a switch which is turned on when the first pull-down code signal NCD1 enabled to have a logic "high" state is applied to a gate thereof. The second pull-down driver 223 further includes a first ALU 2241 that receives the first pull-down calibration code signal NCAL<1> and the second pull-down drive signal PD2 to execute logical operations, an NMOS transistor N26 that electrically couples the ground voltage terminal to the node ND24 and acts as a switch which is turned on in response to an output signal of the first ALU 2241, a second ALU 2242 that receives the second pull-down calibration code signal NCAL<2> and the second pull-down drive signal PD2 to execute logical operations, an NMOS transistor N27 that electrically couples the ground voltage terminal to the node ND24 and acts as a switch which is turned on in response to an output signal of the second ALU 2242, and a resistive element R24 that is coupled to and disposed between the node ND24 and the output node ND_OUT.

The second pull-down drive signal PD2 may be generated in synchronization with the first pull-down delay signal NDS1, and the first pull-down code signal NCD1 may be generated in synchronization with the second input signal INF. Thus, the second pull-down drive signal PD2 may be enabled after the first delay time passes from a point of time when the first pull-down code signal NCD1 is enabled.

The second pull-down driver 224 may pull down the transmission signal TS to have a first unit resistance when the first pull-down code signal NCD1 is enabled. If the first pull-down code signal NCD1 is enabled to have a logic "high" state, the NMOS transistor N25 is turned on. At this time, the NMOS transistors N24, N26, and N27 are turned off since the second pull-down drive signal PD2 maintains a disabled state, i.e., a logic "low" state, until the first delay time passes and thus both of the first pull-down delay signal NDS1 and the second selection signal SEL<2> are enabled to have a logic "high" state. Thus, the second pull-down driver 224 may pull down the level of the transmission signal TS to have the first unit resistance that corresponds to a sum of an on-state resistance of the NMOS transistor N25 and a resistance of the resistive element R24. If the second pull-down drive signal PD2 is enabled after the first pull-down code signal NCD1 is enabled, the second pull-down driver 224 pulls down the level of the transmission signal TS to have a second unit resistance.

That is, if both the first pull-down code signal NCD1 and the second pull-down drive signal PD2 are enabled to have a logic "high" state, the NMOS transistors N24 and N25 are turned on, and on/off states of the NMOS transistors N26 and N27 depend on the first and second pull-down calibration code signals NCAL<1:2>. Thus, the second pull-down driver 224 pulls down the level of the transmission signal TS to have the second unit resistance which is set according to on/off resistances of the NMOS transistors N24, N25, N26, and N27 and the resistances of the resistive elements R23 and R24. The lower the first and second unit resistances are, the stronger the drivability of the second pull-down driver 224 for pulling down the transmission signal TS is.

The second pull-down driver 224 may indirectly pull down the transmission signal TS to have a predetermined resistance value (e.g., the second unit resistance) while the first pull-down driver 212 directly pulls down the transmission signal TS to have a predetermined resistance value. That is, the second pull-down driver 224 may sequentially pull down the transmission signal TS according to the first pull-down code signal NCD1 and the second pull-down drive signal PD2, so that the second pull-down driver 224 may have the first unit resistance and the second unit resistance sequentially. The second unit resistance of the second pull-down driver 224 may be smaller than the first unit resistance and substantially the same as the unit resistance of the first pull-down driver 212. Thus, the drivability of the second pull-down driver 224 for pulling down the transmission signal TS when both the first pull-down code signal NCD1 and the second pull-down drive signal PD2 are enabled may be stronger than the drivability of the second pull-down driver 224 for pulling down the transmission signal TS when the first pull-down code signal NCD1 is enabled while the second pull-down drive signal PD2 is disabled. As a result, a peak current flowing through the second pull-down driver 224 may be reduced by controlling the drivability of the second pull-down driver 124 using the first pull-down code signal NCD1 as well as the second pull-down drive signal PD2.

The third pull-down driver 225 may have substantially the same configuration as that of the second pull-down driver 224. Thus, the third pull-down driver 225 may sequentially pull down the transmission signal TS according to the first pull-down code signal NCD1 and the second pull-down drive signal PD2, so that the third pull-down driver 225 may have the first unit resistance and the second unit resistance in order like the second pull-down driver 224. Each of the fourth and fifth pull-down drivers 235 and 236 may also have substantially the same configuration as that of the second pull-down driver 224. Thus, the fourth and fifth pull-down drivers 235 and 236, respectively, may sequentially pull down the transmission signal TS according to the second pull-down code signal NCD2 and the third pull-down drive signal PD3, so that each of the fourth and fifth pull-down drivers 235 and 236 may have a third unit resistance and a fourth unit resistance sequentially. Similarly, each of the sixth and seventh pull-down drivers 237 and 238 may have substantially the same configuration as that of the second pull-down driver 224. Thus, each of the sixth and seventh pull-down drivers 237 and 238 may sequentially pull down the transmission signal TS according to the second pull-down code signal NCD2 and the fourth pull-down drive signal PD4, so that each of the sixth and seventh pull-down drivers 237 and 238 may have a fifth unit resistance and a sixth unit resistance sequentially. In an embodiment, the fourth unit resistance may be set to be smaller than the third unit resistance, and the sixth unit resistance may be set to be smaller than the fifth unit resistance. Further, the fourth and sixth unit resistances may be substantially the same as the unit resistance of the first pull-down driver 212.

In conclusion, the first pull-down selection driver 21 may pull down the transmission signal TS with the drivability that is set at a point of time when the first pull-down drive signal PD1 is enabled when the first selection signal SEL<1> is enabled. The second pull-down selection driver 22 may sequentially pull down the transmission signal TS with the drivability that is set at points of time when the first pull-down code signal NCD1 and the second pull-down drive signal PD2 are enabled when the second selection signal SEL<2> is enabled. The third pull-down selection driver 23 may sequentially pull down the transmission signal TS with the drivability that is set at points of time when the second pull-down code signal NCD2, the third pull-down drive signal PD3, and the fourth pull-down drive signal PD4 are enabled when the third selection signal SEL<3> is enabled. The first pull-down drive signal PD1, the first pull-down code signal NCD1, and the second pull-down code signal NCD2 may be enabled at a point of time when the second input signal INF is enabled according to enabled states of the selection signals SEL<1:3>. The second pull-down drive signal PD2 and the third pull-down drive signal PD3 may be enabled after the first delay time passes from the point of time when the second input signal INF is enabled, and the fourth pull-down drive signal PD4 may be enabled after the second delay time passes from the point of time when the second input signal INF is enabled. Thus, in this embodiment, the pull-down drivability of the signal transmission circuit may vary at points of time when the second input signal INF, the first pull-down delay signal NDS1, and the second pull-down delay signal NDS2 are enabled.

Figure 9:
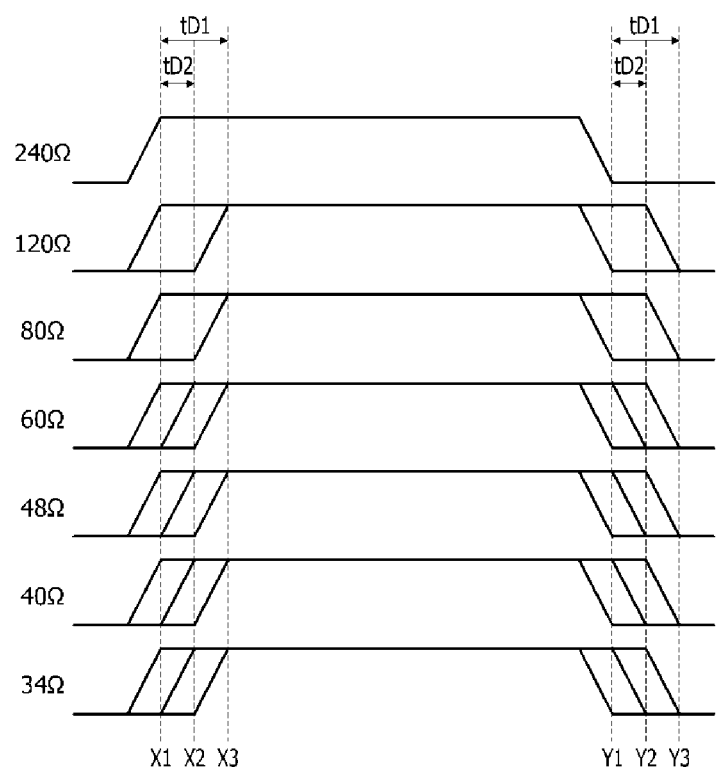
FIG. 9 illustrates a waveform diagram of a transmission signal outputted from the signal transmission circuit shown in FIG. 2, depending on various electrical resistances of the signal transmission circuit, according to an embodiment.

As described above, the transmission signal TS outputted from the signal transmission circuit according to an embodiment may exhibit various waveforms according to the electrical resistance of the signal transmission circuit. The various waveforms of the transmission signal TS are illustrated in FIG. 9. In some embodiments, the electrical resistance of the signal transmission circuit may be set to have various values according to a combination of the logic levels of the first to third selection signals SEL<1:3>, as shown in Table 1. In Table 1, a character "H" denotes a logic "high" state, and a character "L" denotes a logic "low" state.

TABLE 1

| Resistance(Ω) | SEL<1> | SEL<2> | SEL<3> |
| --- | --- | --- | --- |
| 240 | H | L | L |
| 120 | L | H | L |
| 80 | H | H | L |
| 60 | L | L | H |
| 48 | H | L | H |
| 40 | L | H | H |
| 34 | H | H | H |

As can be seen from Table 1, the first selection signal SEL<1> may be enabled when the signal transmission circuit has the electrical resistance of 240Ω, 80Ω, 48Ω, or 34Ω. The second selection signal SEL<2> may be enabled when the signal transmission circuit has the electrical resistance of 120Ω, 80Ω, 40Ω, or 34Ω. The third selection signal SEL<3> may be enabled when the signal transmission circuit has the electrical resistance of 60Ω, 48Ω, 40Ω, or 34Ω.

In the event that the first selection signal SEL<1> is enabled to have a logic "high" state, the signal transmission circuit may pull up the transmission signal TS with the drivability that is set at a point of time when the first pull-up drive signal PUB1 is enabled, and the signal transmission circuit may pull down the transmission signal TS with the drivability that is set at a point of time when the first pull-down drive signal PD1 is enabled. The first pull-up drive signal PUB1 may be enabled in synchronization with the point of time that the first input signal INR is enabled, and the first pull-down drive signal PD1 may be enabled in synchronization with the point of time when the second input signal INF is enabled.

In the event that the second selection signal SEL<2> is enabled to have a logic "high" state, the signal transmission circuit may pull up the transmission signal TS twice with the drivability that is set at points of time when the first pull-up code signal PCDB1 and the second pull-up drive signal PUB2 are sequentially enabled, and the signal transmission circuit may pull down the transmission signal TS twice with the drivability that is set at points of time when the first pull-down code signal NCD1 and the second pull-down drive signal PD2 are sequentially enabled. The first pull-up code signal PCDB1 may be enabled in synchronization with the point of time when the first input signal INR is enabled, and the second pull-up drive signal PUB2 may be enabled after the first delay time passes from the point of time when the first input signal INR is enabled. The first pull-down code signal NCD1 may be enabled in synchronization with the point of time when the second input signal INF is enabled, and the second pull-down drive signal PD2 may be enabled after the first delay time passes from the point of time when the second input signal INF is enabled.

In the event that the third selection signal SEL<3> is enabled to have a logic "high" state, the signal transmission circuit may pull up the transmission signal TS three times with the drivability that is set at points of time when the second pull-up code signal PCDB2, the third pull-up drive signal PUB3, and the fourth pull-up drive signal PUB4 are sequentially enabled, and the signal transmission circuit may pull down the transmission signal TS three times with the drivability that is set at points of time when the second pull-down code signal NCD2, the third pull-down drive signal PD3, and the fourth pull-down drive signal PD4 are sequentially enabled. The second pull-up code signal PCDB2 may be enabled in synchronization with the point of time when the first input signal INR is enabled, the third pull-up drive signal PUB3 may be enabled after the first delay time passes from the point of time when the first input signal INR is enabled, and the fourth pull-up drive signal PUB4 may be enabled after the second delay time passes from the point of time when the first input signal INR is enabled. The second pull-down code signal NCD2 may be enabled in synchronization with the point of time when the second input signal INF is enabled, the third pull-down drive signal PD3 may be enabled after the first delay time passes from the point of time when the second input signal INF is enabled, and the fourth pull-down drive signal PD4 may be enabled after the second delay time passes from the point of time when the second input signal INF is enabled.

Referring to FIG. 9, the transmission signal TS outputted from the signal transmission circuit may exhibit various waveforms according to the electrical resistance of the signal transmission circuit. First, in the event that the electrical resistance of the signal transmission circuit is 240Ω, the signal transmission circuit may pull up the transmission signal TS with the drivability that is set at a point of time "X1" and may pull down the transmission signal TS with the drivability that is set at a point of time "Y1". Next, in the event that the electrical resistance of the signal transmission circuit is 120Ω or 80Ω, the signal transmission circuit may pull up the transmission signal TS with the drivability that is sequentially set at points of time "X1" and "X3" and may pull down the transmission signal TS with the drivability that is sequentially set at points of time "Y1" and "Y3". Finally, in the event that the electrical resistance of the signal transmission circuit is 60Ω, 48Ω, 40Ω, or 34Ω, the signal transmission circuit may pull up the transmission signal TS with the drivability that is sequentially set at points of time "X1", "X2", and "X3" and may pull down the transmission signal TS with the drivability that is sequentially set at points of time "Y1", "Y2", and "Y3". The point of time "X1" may correspond to the point of time that the first input signal INR is enabled, the point of time "X2" may be obtained by delaying the point of time "X1" by a second delay time tD2, and the point of time "X3" may be obtained by delaying the point of time "X1" by a first delay time tD1. Similarly, the point of time "Y1" may correspond to the point of time that the second input signal INF is enabled, the point of time "Y2" may be obtained by delaying the point of time "Y1" by the second delay time tD2, and the point of time "Y3" may be obtained by delaying the point of time "Y1" by the first delay time tD1.

As described above, in accordance with embodiments, the drivability of the signal transmission circuit may be controlled at a maximum three points of time even though the electrical resistance of the signal transmission circuit varies. Thus, a variation of the drivability of the signal transmission circuit may be reduced to minimize a variation of a slew rate of the transmission signal outputted from the signal transmission circuit.

The above-described embodiments have been disclosed above for illustrative purposes. Those skilled in the art will appreciate that various modifications, additions and substitutions are possible, without departing from the scope and spirit of the present invention as disclosed in the accompanying claims.

What is claimed is:
1. A signal transmission circuit, comprising:
a first selection driver configured to generate a first drive signal in response to an input signal and a first selection signal, and drive a transmission signal in response to the first drive signal; and
a second selection driver configured to delay the input signal by a first delay time to generate a first delay signal, generate a second drive signal in response to the first delay signal and a second selection signal, generate a first code signal in response to the input signal and the second selection signal, and drive the transmission signal in response to the second drive signal and the first code signal.

2. The circuit of claim 1, wherein each of the first and second selection signals is enabled by a mode register setting operation.

3. The circuit of claim 1, wherein the first selection driver includes:
a first drive signal generator configured to generate the first drive signal that is enabled when the input signal is enabled while the first selection signal is enabled; and
a first driver configured to drive the transmission signal when the first drive signal is enabled.

4. The circuit of claim 3, wherein the first driver includes a plurality of resistive elements and is configured to drive the transmission signal to have a unit resistance which is set according to calibration code signals outputted from an impedance calibration circuit when the first drive signal is enabled.

5. The circuit of claim 1, wherein the second selection driver includes:
a first delay portion configured to delay the input signal by the first delay time to generate the first delay signal;
a second drive signal generator configured to generate the second drive signal that is enabled when the first delay signal is enabled while the second selection signal is enabled;
a first code generator configured to generate the first code signal that is enabled when the input signal is enabled while the second selection signal is enabled; and
a second driver configured to drive the transmission signal in response to the second drive signal and the first code signal.

6. The circuit of claim 5, wherein the second drive signal is enabled after the first delay time passes from a point of time when the first code signal is enabled.

7. The circuit of claim 6, wherein the second driver includes a plurality of resistive elements and is configured to drive the transmission signal to have a first unit resistance at the point of time when the first code signal is enabled and drive the transmission signal to have a second unit resistance, which is set according to calibration code signals outputted from an impedance calibration circuit, at a point of time when the second drive signal is enabled.

8. The circuit of claim 7, wherein the second driver includes:
a first switch which electrically couples a power supply terminal to a first node and is turned on in response to the second drive signal;
a first resistive element which is coupled to and disposed between the first node and an output node through which the transmission signal is outputted;

a second switch which electrically couples the power supply terminal to a second node and is turned on in response to the first code signal; and a second resistive element which is coupled to and disposed between the second node and the output node.

9. The circuit of claim 8, wherein the second driver further includes a third switch which electrically couples the power supply terminal to the second node and is turned on in response to the second drive signal and the calibration code signals.

10. The circuit of claim 7, wherein the second driver includes:

a first switch which electrically couples a ground voltage terminal to a first node and is turned in response to the second drive signal;

a first resistive element which is coupled to and disposed between the first node and an output node through which the transmission signal is outputted;

a second switch which electrically couples the ground voltage terminal to a second node and is turned on in response to the first code signal; and a second resistive element which is coupled to and disposed between the second node and the output node.

11. The circuit of claim 10, wherein the second driver further includes a third switch which electrically couples the ground voltage terminal to the second node and is turned on in response to the second drive signal and the calibration code signals.

12. The circuit of claim 5, wherein the second selection driver further includes a third driver configured to drive the transmission signal in response to the second drive signal and the first code signal.

13. The circuit of claim 1, further comprising a third selection driver, wherein the third selection driver is configured to generate a third drive signal in response to a third selection signal and the first delay signal, generate a second code signal in response to the third selection signal and the input signal, delay the input signal by a second delay time to generate a second delay signal, generate a fourth drive signal in response to the third selection signal and the second delay signal, drive the transmission signal in response to the third drive signal and the second code signal, and drive the transmission signal in response to the fourth drive signal and the second code signal.

14. The circuit of claim 13, wherein the drivability of the signal transmission circuit is selectively controlled at a plurality of points of time in response to the first to third selection signals, thereby changing an impedance of the signal transmission circuit, the plurality of points of time including a first point of time when the input signal is enabled, a second point of time obtained by delaying the first point of time by the second delay time, and a third point of time obtained by delaying the first point of time by the first delay time.

15. The circuit of claim 14, wherein the second delay time is shorter than the first delay time.

16. A signal transmission circuit, comprising:

a delay portion configured to delay an input signal by a predetermined delay time to generate a delay signal;

a drive signal generator configured to generate a drive signal that is enabled when the delay signal is enabled while a selection signal is enabled;

a code generator configured to generate a code signal that is enabled when the input signal is enabled while the selection signal is enabled; and a first driver configured to drive a transmission signal in response to the drive signal and the code signal.

17. The circuit of claim 16, wherein the selection signal is enabled by a mode register setting operation.

18. The circuit of claim 16, wherein the drive signal is enabled after the delay time passes from a point of time when the code signal is enabled.

19. The circuit of claim 18, wherein the first driver includes a plurality of resistive elements and is configured to drive the transmission signal to have a first unit resistance at the point of time when the code signal is enabled and drive the transmission signal to have a second unit resistance, which is set according to calibration code signals outputted from an impedance calibration circuit, at a point of time when the drive signal is enabled.

20. The circuit of claim 19, wherein the first driver includes:

a first switch which electrically couples a power supply terminal to a first node and is turned on in response to the drive signal;

a first resistive element which is coupled to and disposed between the first node and an output node through which the transmission signal is outputted;

a second switch which electrically couples the power supply terminal to a second node and is turned on in response to the code signal; and a second resistive element which electrically couples the second node to the output node.

21. The circuit of claim 20, wherein the first driver further includes a third switch which electrically couples the power supply terminal to the second node and is turned on in response to the drive signal and the calibration code signals.

22. The circuit of claim 19, wherein the first driver includes:

a first switch which electrically couples a ground voltage terminal to a first node and is turned in response to the drive signal;

a first resistive element which is coupled to and disposed between the first node and an output node through which the transmission signal is outputted;

a second switch which electrically couples the ground voltage terminal to a second node and is turned on in response to the code signal; and a second resistive element which is coupled to and disposed between the second node and the output node.

23. The circuit of claim 22, wherein the first driver further includes a third switch which electrically couples the ground voltage terminal to the second node and is turned on in response to the drive signal and the calibration code signals.

24. The circuit of claim 16, further comprising a second driver configured to drive the transmission signal in response to the drive signal and the code signal.

25. A signal transmission circuit, comprising:

a first switch which electrically couples a power supply terminal to a first node and is turned in response to a drive signal;

a first resistive element which is coupled to and disposed between the first node and an output node through which a transmission signal is outputted;

a second switch which electrically couples the power supply terminal to a second node and is turned on in response to a code signal; and a second resistive element which electrically couples the second node to the output node.

26. The circuit of claim 25, further comprising a third switch which electrically couples the power supply terminal to the second node and is turned on in response to a calibration code signal outputted from an impedance calibration circuit and the drive signal.

* * * * *